Figure 1:
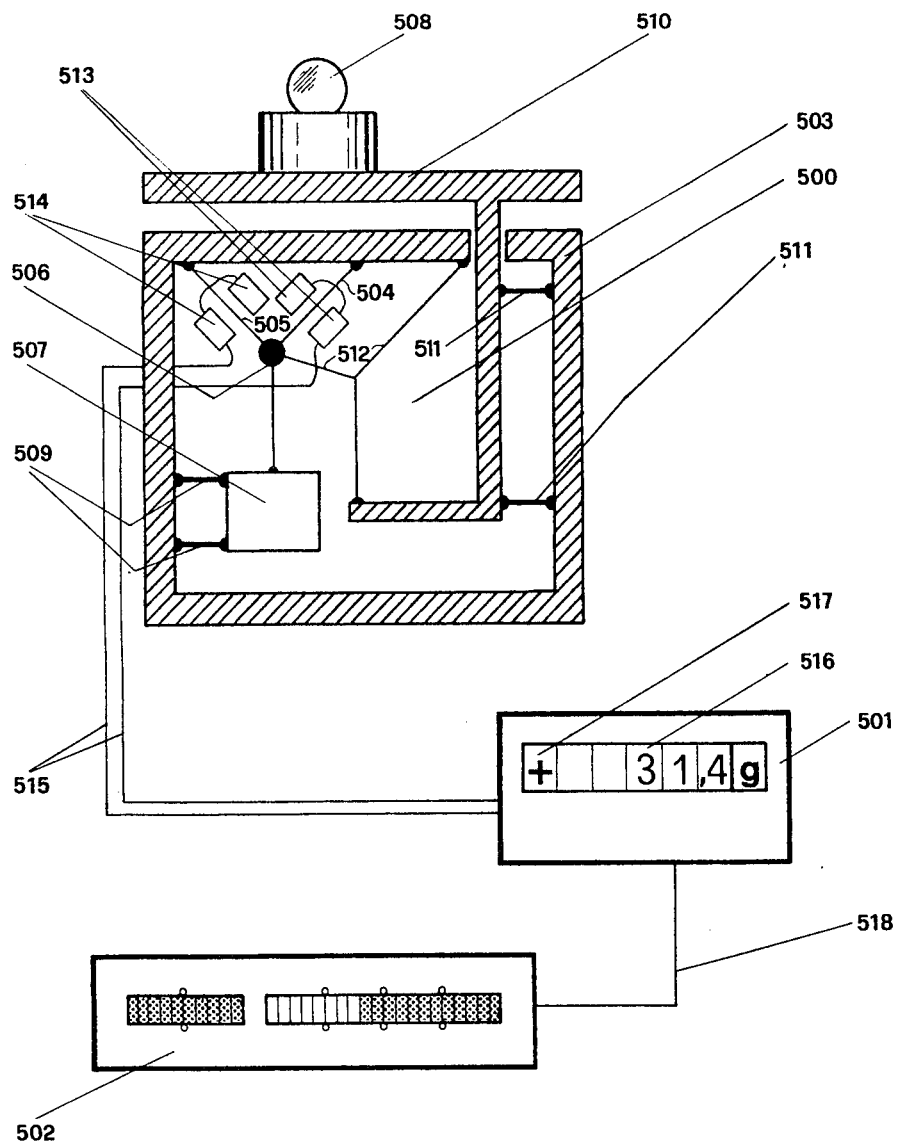

United States Patent [19]

Gallo et al.

[11] 4,076,088
[45] Feb. 28, 1978

[54] BALANCE WITH A DIGITAL AND AN ANALOGUE DISPLAY

[75] Inventors: Mario Gallo; Johannes Wirth, both of Zurich, Switzerland

[73] Assignee: Wirth, Gallo and Company, Switzerland

[21] Appl. No.: 771,315

[22] Filed: Feb. 23, 1977

[30] Foreign Application Priority Data

Jun. 9, 1976 Switzerland ............... 007322/76

[51] Int. Cl.² ................. G01G 3/14; G01G 23/36
[52] U.S. Cl. ..................... 177/210 R; 177/177; 177/DIG. 3
[58] Field of Search ........... 177/177, 210 R, 201 FP, 177/DIG. 3

[56] References Cited

U.S. PATENT DOCUMENTS

| 3,052,409 | 9/1962 | Williams, Jr. | 177/210 FP |
| 3,655,003 | 4/1972 | Yamajima | 177/177 X |

FOREIGN PATENT DOCUMENTS

| 2,149,116 | 4/1973 | Germany | 177/DIG. 3 |

*Primary Examiner*—George H. Miller, Jr.
*Attorney, Agent, or Firm*—Stevens, Davis, Miller & Mosher

[57] ABSTRACT

Scale with a digital display and an additional analogue display, the latter comprising at least one group of optically activable elements forming a row, each element corresponding to a value range of results of weighing operations, the length of the higher order range being at least ten times the length of the lower order range, all elements corresponding to value ranges lower than the value range to be displayed being activated.

6 Claims, 17 Drawing Figures

BALANCE WITH A DIGITAL AND AN ANALOGUE DISPLAY

The present invention concerns a scale with a digital display unit and an additional analogue display unit.

Such scales are known, for instance as substitution scales with switch weights, in which the substituted weights are digitally displayed. The weight not substituted in the lowest weight decade is displayed by a mechanical hand or a projected light indicator, i.e. it is indicated by analogue displaying. Also commercial scales are known, in which the bigger units — e.g. kilograms — are displayed digitally and the finer units down to grams are displayed by means of a mechanical hand. In all these scales the display of the total result is split into a digitally and an analogue displayed part.

Further scales, in particular inclination scales, are known in which the results of weighing operations is displayed in an analogue way by a light indicator and simultaneously are digitally assessed by means of a code disk.

The result is then displayed digitally and in an analoguous way. The main purpose of the digital display is further arithmetical processing.

In the mentioned analogue displays formed by a graduation and hands, the absolute resolution is, by its very nature, constant over the whole value range of the scale and equal to the finest unit. With the first mentioned scale with split display, only a small part of the whole value range is displayed in an analogue way. Within this part the absolute resolution is again constant and equal to the smallest unit.

When scales are mounted in packing rows as batch feeders, sorting scales and transport belt scales pre-determined weight values must generally be achieved. Technically speaking it is not relevant how much is the absolute value of the weight measured but rather in which ratio it is to the pre-determined value.

It is well known that digitally displayed values are not very suitable for comparison of actual value and pre-determined value. Substitution scales are unsuitable because the approximation of the pre-determined value by the actual value can be recognized only when the difference between these two values lies within the analogue displayed finest decade; too little time remains for instance at a feeding position for manipulations by the operator.

In scales with mechanical hands for coarse units — for instance kilograms — the two displays must constantly be observed, which, as experience shows, leads to early tiredness and false appreciations.

If the weighing result must be evaluated only with help of the additional analogue graduation of a scale with digital display, the resolution of the analogue graduation cannot meet high requirements: projected graduations moving before a window cannot be used in feeding applications because when moving they can barely be read, it is therefore necessary to use stationary graduations with hands or similar means. This limits strongly the resolution. If a graduation must have a resolution of 1 out of $10^4$ of the highest possible weight and if per graduation mark 1 mm is needed, this represents a graduation of 10 m, which is practically not feasible.

All scales mentioned are scales with an analogue determination of the weight. With scales with a digital determination of the weight, as in Swiss Pat. Nos. 447 653 or 492 961, an analogue value will have to be derived from the digital value. To display it by means of a graduation with hands or similar means would mean a decrease of the resolution by a factor of about one hundred.

The object of the invention is to provide a scale with digital display and an additional analogue display whose resolution varies in function of the total capacity of the display. The significance of the values observed should depend on their numeric values. Such a display is particularly needed where comparisons between a pre-determined value and an actual value must be made, e.g. in feeding installations (scales for batch feeder, sorters, transport belt operation). It is in general required to recognize small differences between the pre-determined and the actual values with much higher precision than big differences. In extreme cases it can be required that the small differences are displayed with the highest possible accuracy, e.g. with a resolution of 1 out of $10^4$ with respect to the highest possible weight, whilst for bigger differences a display accuracy of 10% would suffice.

The scale according to the invention has a digital display for digitally displaying the results of weighing operations, said results falling within discrete value ranges, the length of the highest value range being at least ten times bigger than the length of the lowest value range, an analogue display in said scale for simultaneous analogue displaying of said results of weighing operations, said analogue display comprising at least one group of optically activable elements forming a row, said elements corresponding each to one of said discrete value ranges and being connected to each other so that the elements corresponding to value ranges lower than the value range to be displayed by activation of the corresponding element are also activated.

Embodiments of the object of the invention are represented schematically in the drawing.

Figure 2:
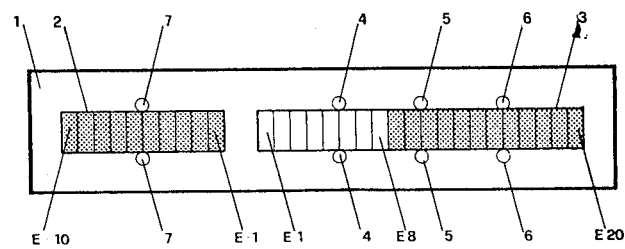
Figure 3:
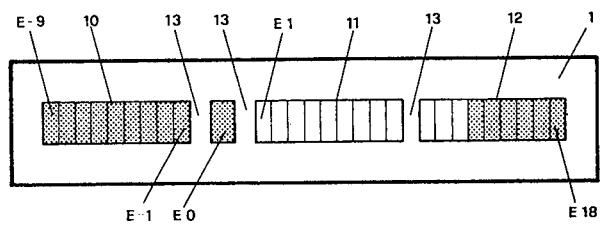
Figure 4:
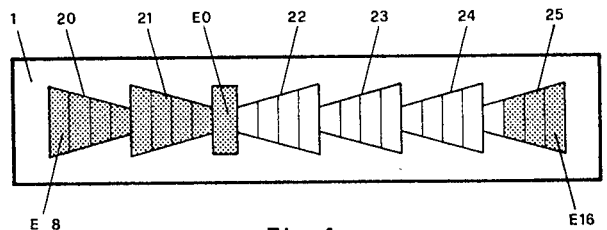
Figure 5:
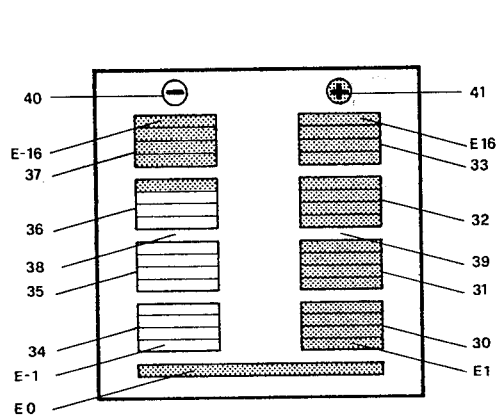
Figure 6:
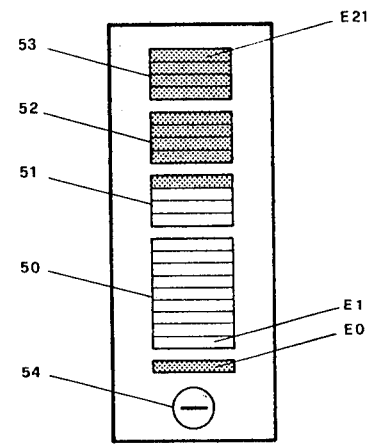
Figure 7:
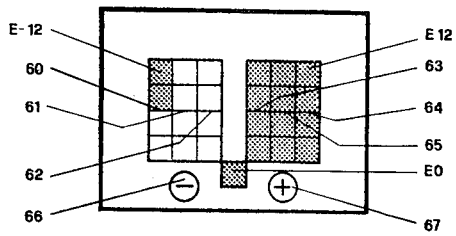
Figure 8:
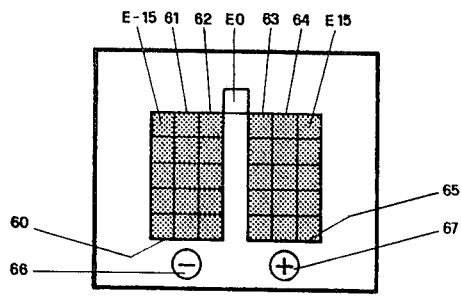
Figure 9:
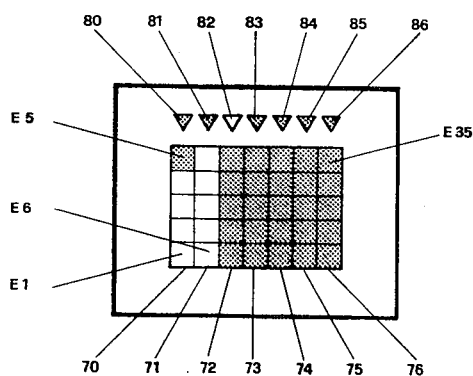
Figure 10:
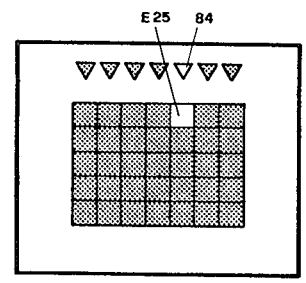
Figure 11:
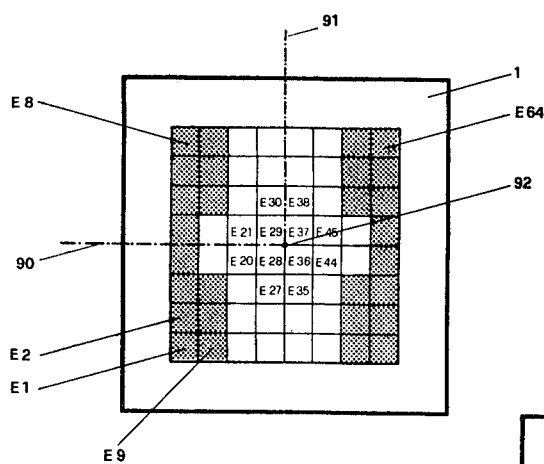
Figure 12:
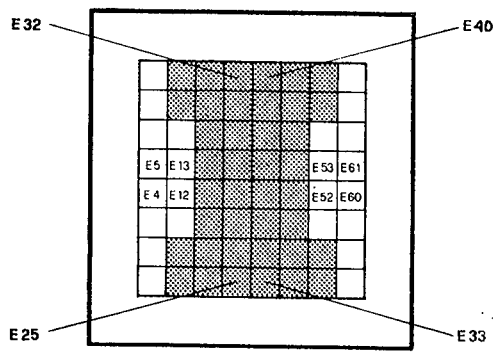
Figure 13:
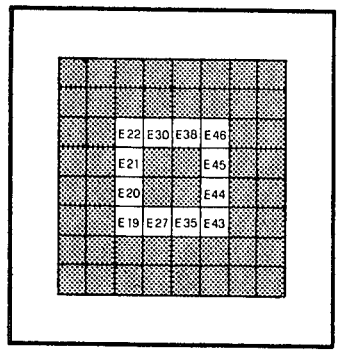
Figure 14:
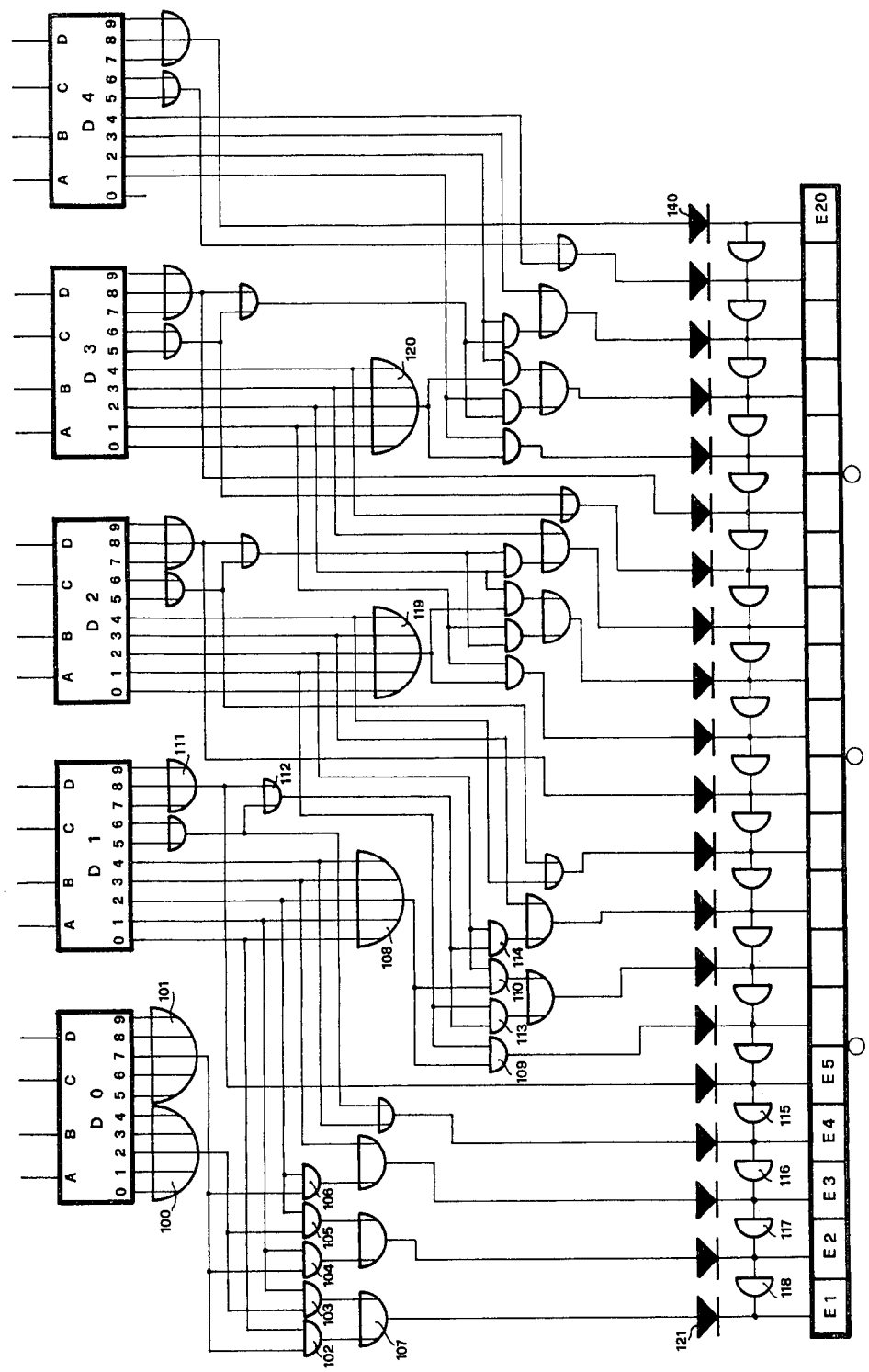
Figure 15:
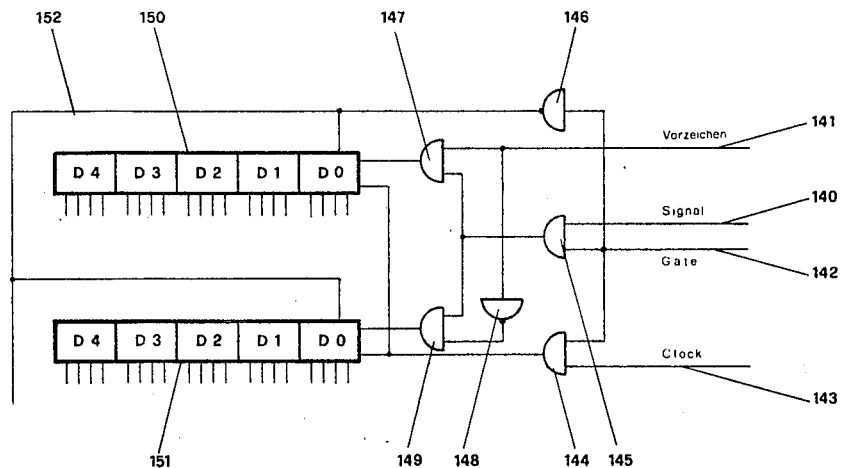
Figure 16:
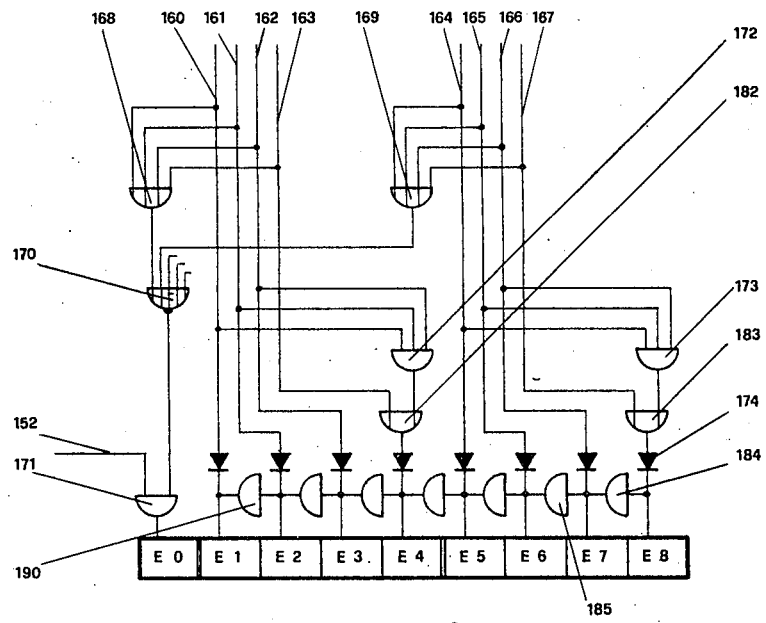
Figure 17:
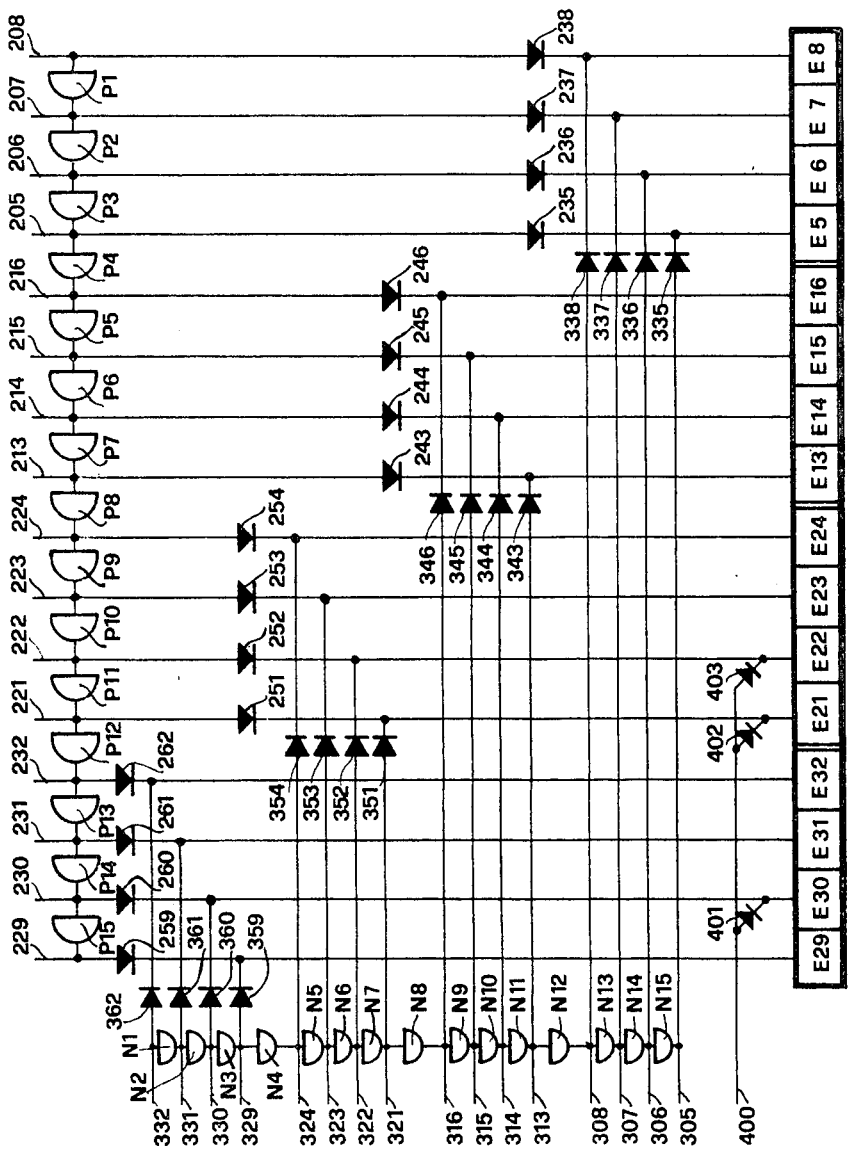

FIG. 1 shows a first embodiment,
FIG. 2 shows the display unit of the first embodiment,
FIG. 3 shows a second embodiment of this display unit,
FIG. 4 shows a third embodiment of this display unit,
FIG. 5 shows a fourth embodiment of this display unit,
FIG. 6 shows a variant to these four embodiments of the display unit,
FIG. 7 shows a variant of FIG. 4 or 5,
FIG. 8 shows a variant of FIG. 7,
FIG. 9 shows a variant of FIGS. 7 and 8,
FIG. 10 shows the same embodiment as FIG. 9 but with another value displayed,
FIGS. 11, 12, 13 show a further embodiment with different values,
FIG. 14 shows an embodiment of a circuitry for the allocation of value ranges to elements,
FIG. 15 shows a basic circuitry,
FIG. 16 shows another embodiment of a circuitry for the allocation of value ranges to elements,
FIG. 17 shows the circuitry corresponding to FIGS. 11, 12, 13.

FIG. 1 shows schematically a first embodiment, comprising a vibrating string scale 500, a computing and digital display unit 501 and an analogue display unit 502. Scale 500 has a frame 503 to which two vibrating strings 504, 505 are fixed. The lower ends of these strings 504, 505 are fixed to a head 506 on which the weight of a reference mass 507 and a force proportional to the weight of the unknown mass 508 are acting. Mass 507 is attached to frame 503 by means of parallel guides 509. Mass 508, which must be determined, lies on a load platform 510, which is attached to frame 503 by means of parallel guides 511. The weight of mass 508 is transmitted to head 506 by means of wires 512. Exciting and pick-up heads 513, 514 are mounted near each string 504, 505. They transmit the vibration of strings 504, 505 to computing and digital display unit 501 over a line 515. In this unit 501 the two frequencies of strings 504, 505 are compared so as to assess thereby in a well known manner the magnitude of mass 508 and to display it digitally. In the embodiment of FIG. 1 the digital display unit comprises a five-digit display field 516 and a sign field 517. Unit 501 is connected over a line 518 to analogue display unit 502, which is represented in detail in FIG. 2.

FIG. 2 shows a first embodiment of the analogue display unit. A frame 1 comprising two rows 2, 3 of optically activable elements E1 to E20 and E-1 to E-10. Double marks 4, 5, 6, 7 are foreseen after every fifth element, so as to divide both rows 2, 3 of elements E1 to E20 and E-1 to E-10 in segments of equal length. Marks 4 to 7 can be for instance permanent coloured marks on frame 1 or be optically activable together with elements E5, E10, E15 and E-5.

For the purpose of this description an optically activable element is an element having the form of a point or a line or a surface which can be in either of two optical states, e.g. dark-luminous, transparent-not transparent, colour A - colour B. Examples of such elements: glim lamps, glow lamps, display flaps, light emitting diodes, liquid crystals.

The individual elements of FIG. 2 correspond to the following value ranges W:

| — (no display) | $0.0 \leq W < 0.4$ |
|---|---|
| E1 | $0.5 \leq W < 1.4$ |
| E2 | $1.5 \leq W < 2.4$ |
| E3 | $2.5 \leq W < 3.9$ |
| E4 | $4.0 \leq W < 6.9$ |
| E5 | $7.0 \leq W < 9.9$ |
| E6 | $10.0 \leq W < 14.9$ |
| E7 | $15.0 \leq W < 24.9$ |
| E8 | $25.0 \leq W < 39.9$ |
| E9 | $40.0 \leq W < 69.9$ |
| E10 | $70.0 \leq W < 99.9$ |
| . | ... |
| . | ... |
| E19 | $4000.0 \leq W < 6999.9$ |
| E20 | $7000.0 \leq W < 9999.9$ |
| — (no display) | $0.0 \leq W < -0.4$ |
| E-1 | $-0.5 \leq W < -1.4$ |
| E-2 | $-1.5 \leq W < -2.4$ |
| E-3 | $-2.5 \leq W < -3.9$ |
| E-4 | $-4.0 \leq W < -6.9$ |
| E-5 | $-7.0 \leq W < -9.9$ |
| . | ... |
| . | ... |
| E10 | $-70.0 \leq W < -99.9$ |

In FIG. 2 elements E1 to E8 are shown optically activated, the unit indicates, according to the above table, that the value observed lies between 25.0 and 39.9.

The right hand side of unit 1 is twice as long as the left hand side and in view of the logarithmic scale it encompasses a value range 100 times bigger. Such units are desirable where a pre-determined value must be achieved by approximation from one side, for instance in a batch feeder: on the right hand side the missing quantity of the material to be fed is indicated and on the left hand side the quantity in excess is indicated in case of an overfeeding.

The fact that the definition of the ranges associated to E1 and E-1 deviates from the systematic definitions of the other ranges, is due to the need of leaving the zero range when the value 0.5 is reached.

FIG. 3 shows a second embodiment. Frame 1, which could be the front wall of the device, comprises three groups 10, 11, 12 of optically activable elements E-1 to E-9 and E1 to E18. Each group 10, 11, 12 comprises nine elements. This frame 1 has an additional element E0. The allocation of value ranges to the elements is as follows:

| E-9 | $W \leq -0.9$ |
|---|---|
| E-8 | $-0.8 \leq W < -0.9$ |
| E-7 | $-0.7 \leq W < -0.8$ |
| . | ... |
| . | ... |
| E-3 | $-0.3 \leq W < -0.4$ |
| E-2 | $-0.2 \leq W < -0.3$ |
| E-1 | $-0.1 \leq W < -0.2$ |
| E0 | $-0.1 \leq W < +0.1$ |
| E1 | $+0.1 \leq W < +0.2$ |
| E2 | $0.2 \leq W < 0.3$ |
| . | ... |
| . | ... |
| E9 | $0.9 \leq W < 1.0$ |
| E10 | $1.0 \leq W < 2.0$ |
| E11 | $2.0 \leq W < 3.0$ |
| . | ... |
| . | ... |
| E18 | $9.0 \leq W < 10.0$ |

One group of nine optically activable elements corresponds to one decade. It goes without saying that the number of decades on each side of element E0 can be enlarged depending upon the needs of the application considered, the resolution and the capacity of the scale (or instrument) whose results must be displayed.

Groups 10, 11, 12 and element E0 are separated from each other by free section 13.

In FIG. 3 the unit indicates that the value measured is within range $3.0 \leq W < 4.0$.

The embodiment according to FIG. 4 has six groups 20, 21, 22, 23, 24 and 25 of optically activable elements mounted in frame 1. Each of these groups 20 to 25 comprises six optically activable elements E8 to E1, E0, E-1 to E-16. Element E0 corresponds to the zero range. Within a given group the values displayed grow approximately with a factor 3. The allocation of value ranges to the elements is as follows:

| E-8 | $-10.0 \leq W < -7.5$ |
|---|---|
| E-7 | $-7.5 \leq W < -5.5$ |
| E-6 | $-5.5 \leq W < -4.0$ |
| E-5 | $-4.0 \leq W < -3.0$ |
| E-4 | $-3.0 \leq W < -2.3$ |
| E-3 | $2.3 \leq W < -1.7$ |
| E-2 | $-1.7 \leq W < -1.3$ |
| E-1 | $-1.3 \leq W < -1.0$ |
| E0 | $-1.0 \leq W < +1.0$ |
| E1 | $+1.0 \leq W < 1.3$ |
| E2 | $1.3 \leq W < 1.7$ |
| E3 | $1.7 \leq W < 2.3$ |
| E4 | $2.3 \leq W < 3.0$ |
| E5 | $3.0 \leq W < 4.0$ |
| E6 | $4.0 \leq W < 5.5$ |
| E7 | $5.5 \leq W < 7.5$ |
| E8 | $7.5 \leq W < 10.0$ |
| E9 | $10.0 \leq W < 13.0$ |
| . | ... |
| . | ... |

| E16 | 75.0 ≦ W < 100.0 |

The value indicated in FIG. 4 is 30 ≦ W < 40.

Within the groups 20 to 25 the elements are optically linked in that, within each group, their length increases transversally to the direction of growing values.

FIG. 5 shows a further embodiment. Eight groups 30, 31, 32, 33, 34, 35, 36, 37 of optically activable elements are ordered into two equally long columns 38, 39. Each group 30–37 comprises four elements from E-16 to E16. The zero range corresponds to a specific element E0. The allocation of ranges to the elements is fully symmetrical for positive and negative values. For the sake of simplicity only the positive values are shown hereafter:

| E0  | −1 < W < +1       |
| E1  | +1 ≦ W < +2       |
| E2  | 2 ≦ W < 4         |
| E3  | 4 ≦ W < 7         |
| E4  | 7 ≦ W < 10        |
| E5  | 10 ≦ W < 20       |
| E6  | 20 ≦ W < 40       |
| E7  | 40 ≦ W < 70       |
| .   | ...               |
| .   | ...               |
| .   | ...               |
| E16 | 7000 ≦ W < 10'000 |

On the top of each column 38, 39 there is an optically activable element 40, 41 indicating the relevant sign. Groups 30 to 37 are slightly separated from each other by free space.

FIG. 6 shows an embodiment in which some of the previous embodiments have been combined. It comprises four decades — as in FIG. 5. The first decade is divided in nine value ranges, as in FIG. 2, the other decades are divided in four value ranges, as in FIG. 5. Each decade is indicated by one group 50, 51, 52, 53 of optically activable elements E1 to E21. The zero range is indicated by the element E0. Groups 50–53 form a column. Below group 50 is an optically activable element 54 indicating the sign.

The allocation of value ranges to elements is as follows:

| E0  | −1 ≦ W +1         |
| E1  | 1 ≦ W 2           |
| .   | ...               |
| .   | ...               |
| .   | ...               |
| E9  | 9 ≦ W < 10        |
| E10 | 10 ≦ W < 20       |
| E11 | 20 ≦ W 40         |
| E12 | 40 ≦ W 70         |
| E13 | 70 ≦ W 100        |
| .   | ...               |
| .   | ...               |
| E21 | 7000 ≦ W < 10'000 |

The value indicated in FIG. 6 lies within the range −40 ≦ W < −70. Also in this embodiment, groups 50 to 53 are separated from each other by free space.

FIG. 7 shows a variant to FIG. 4 or FIG. 5. It comprises six groups 60, 61, 62, 63, 64, 65 of four optically activable elements E-12 to E12. Between the negative and the positive values there is an element E0 indicating the zero range. Below groups 60–62 and 63–65 there are two sign elements 66, 67 which are also optically activable. Increasing values within a given group move up, increasing values of the groups move from inside toward the outside.

If the allocation of value ranges to elements is the same as for the embodiment of FIG. 4 the displayed value is within −13.0 ≦ W < −17.0. If this allocation is that of FIG. 5, the displayed value is within −200 ≦ W < −400.

In FIG. 8 a variant of FIG. 7 is represented. Each group 60 to 65 is divided in five elements E-15 to E15 with an element E0 indicating the zero range. In FIG. 8 it is the only activated element. As the allocation of value ranges to elements is that of FIG. 3, the displayed value is within −0.5 ≦ W < +0.5.

FIG. 9 shows a variant of the embodiments of FIGS. 7 and 8. The display unit is divided into seven groups 70, 71, 72, 73, 74, 75, 76 of five elements each. The numbering of the elements starts with the lowest element E1 on the left hand side and runs in group 70 up to E5. Group 71 starts with E6. The last uppermost element of group 76 is thereby E35. Over each group 70 to 71 there is an optically activable marker 80 to 86. In FIG. 9 mark 82 is activated. This means that the zero range corresponds to the uppermost element E15 of group 72. As a result the element indicating the zero range can be selected at will. This is a desirable feature in dosing machines with several components to be weighed. With the value range to elements allocation of FIG. 2 the displayed value is within −40 = W < −69.9.

In FIG. 10 the embodiment of FIG. 9 is shown with another value displayed, mark 84 being activated, element E25 corresponds to the zero range and the displayed value is within −0.5 ≦ W +0.5.

In FIGS. 11, 12, 13 a further embodiment is shown in which 64 optically activable elements are mounted in frame 1 so as to form a square. They are numbered from E1 to E64 as shown, in the same way as in FIG. 9. The quadrant limited by lines 90, 91 is the so-called prime cell of the display unit, the other three quadrants forming further three cells. If the value to be displayed is within the first positive value range outside the zero range, the four elements E28, E29, E36, E37 around the centre of 29 of the display are activated. The next value ranges comprise elements E27, E30, E35, E38, so that when the value to be displayed increases, the activated part of the display becomes higher. Once the field height is reached, then elements E20, E21, E44, E45 are activated, so that the activated area becomes broader in its middle. When the value to be displayed increases further, then this broader part again becomes higher. With the allocation of value ranges to elements according to FIG. 5, the display in FIG. 11 is +100 ≦ W < 200.

For negative values a complementary representation is used. The elements corresponding to the first negative value range are elements E4, E5, E60, E61. When the value increases — in the negative range — the activated part of the display part becomes higher. When both outside columns of elements are fully activated, the next elements to be activated are elements E12, E13, E52, E53, and so on, until almost the whole display is activated. Elements E25, E32, E35, E40 are never activated when negative values are displayed. This in order to avoid confusion in case of a fully activated display. In this embodiment the negative range is therefore smaller than the positive range. It is of course possible to make the positive range smaller than the negative range. With the value range to elements allocation of FIG. 10, the value displayed in FIG. 12 is $-20 \leq W < -40$.

The display of the zero range is shown in FIG. 13. Elements E19 to E22, E27, E30, E35, E43 to E46 are activated when the value to be displayed is within the zero range. The activated elements form an easily recognizable pattern.

FIG. 14 shows an embodiment of a circuitry for the activation of the elements. The allocation of value ranges to elements is that of FIG. 2, 8, 9, 10 and the designation of the elements is that of FIG. 2.

The measured values are transmitted as digital values, either parallel by bit or parallel by word, to five decades D0, D1, D2, D3, D4 of the circuitry of FIG. 14. Each decade D0 to D4 decodes a BCD coded value into a pure decimal value. The powers of 10 are allocated as follows:

D0 from 0.0 to 0.9.
D1 from 1.0 to 9
D2 from 10 to 90
D3 from 100 to 900
D4 from 1000 to 9000

The highest displayable value is 9999.9. The operation of this circuitry will be explained by describing allocations of measured values to value ranges. The assumed measured value is 0.4. Decade D0 has four BCD inputs, D0A, D0B, D0C, D0D with the corresponding weights 1, 2, 4, 8. A signal corresponding to logical ONE is transmitted only to input D0C. Decade D0 has ten outputs D00 to D09. According to the usual design of such commercially available decades, a ONE signal appears at output D04. Outputs D00 to D04 are connected to an OR-gate 100 and outputs D05 to D09 are connected to an OR-gate 101. The ONE signal appearing therefore at the output of OR-gate 100 is transmitted to an AND-gate 103. The other input of this AND-gate 103 receives only ZERO signals because inputs D1A, D1B, D1C, D1D of decade D1 receive only ZERO signal. The output signal of AND-gate 103 is a ZERO signal. Element E1 remains unactivated, which corresponds to the allocation of value ranges, as 0.4 being in the zero range, it should not be displayed according to FIG. 2. If the assumed value is 1.4, the above description with regard to decade D0 for the value 0.4 remains valid, additionally a ONE signal is transmitted to input D1A of decade D1 and is further transmitted to output D11. The output signal of AND-gate 103 is now also a ONE and is transmitted to an OR-gate 107. The output signal ONE of this OR-gate 107 activates element E1. The ONE signal at output D11 is transmitted to an OR-gate 108 and further to the inputs of two AND-gates 109, 110. As the other inputs of these two AND-gates 109, 110 remain unactivated, no change of their state results.

If the assumed value is 7.7, ONE signals are transmitted to inputs D0A, D0B, D1A, D1B, D1C and, according to the design of decades D0, D1, to the outputs D07 and D17. The ONE signal at output D07 is transmitted to AND-gates 102, 104, 106. As their other input remains unactivated, their outputs remain unactivated, too. The ONE signal at output D17 is transmitted over OR-gate 111 to element E5 and to an OR-gate 112. The output of this OR-gate 112 is connected to AND-gate 113, 114 whose other input remains unactivated. Beside element E5, a pulse former 115 is also activated, which in turn activates element E4 and a further pulse former 116. Activation is propagated over pulse formers 117, 118 to elements E3, E3, E1. So all elements from the originally activated element - here E5 - down to E1 are also activated.

The operation of decades D2, D3 is identical to that of decade D1. Decade D4 is different because there is no higher order decade. Outputs D40, D41, D42, D43 and D44 must no more be related to each other. There is no OR-gate corresponding to OR-gates 108, 119 and 120. Output D40 is not needed.

The outputs of all gates preceding elements E1 to E20 are protected by diodes 121 to 140.

In FIG. 15 an embodiment of the basic circuitry is shown. In this circuitry the digital results of the measurements performed are handled so as to be able to be displayed on the analogue display.

A line 140 for signals and three further lines 141, 142, 143 connect this circuitry to the scale. In this embodiment the transmission of the results is serial by bit and serial by word. This means that on line 140 the result is represented by a series of rectangular pulses. Line 141 transmits the sign of the result. If the sign is positive, it transmits a ONE signal. Line 142 is called "Gate": during transmission only its tension corresponds to a ONE, else to a ZERO. Line 143, called "Clock" transmits the time base, a regular series of ONE pulses, so that the weight of the ONE pulses in line 140 together with the "Gate"-signal in line 142 is always well defined.

The "Gate"-signal from line 142 is delivered to two AND-gates 144, 145 and to an inverter 146. The sign signal of line 141 is delivered to an AND-gate 147 and over an inverter 148 to a further AND-gate 149. In the present embodiment according to FIG. 15 the result can have five decades. Within one decade the value is BCD coded, so that the whole result needs $5 \times 4 = 20$ pulse periods. When a positive result is transmitted, lines 141 and 142 are under the tension corresponding to a ONE signal, the pulses corresponding to the result appear in line 140 synchronous with the clock pulses in line 143. With each pulse of line 140, AND-gate 145 opens and the pulse is transmitted to AND-gates 147, 149. Because of inverter 148, a NULL is constantly fed to AND-gate 149, so that it remains closed during the whole transmission time. AND-gate 147 is constantly fed with the ONE signals from line 141 so that the pulses can enter a shift register 150 comprising five decades D0, D1, D2, D3, D4. Clock pulses reach this register over AND-gate 144, so that after pulses the whole result is stored in register 150. Each decade D0 to D4 of register 150 has four outputs with the weights 1, 2, 4, 8 according to the BCD code.

After transmission of the result, the "gate" signal in line 141 is switched to ZERO and the output of inverter 146 changes over to ONE. This ONE signal now is delivered over line 152 to shift register 151 also comprising five decades D0 to D4. This ONE signal in line 152 provokes transfer of the signals stored in shift register 150 to the outputs of decades D0 to D4 of shift register 150. These outputs remain statically under the corresponding tensions as long as the "Gate"-signal is ZERO. They are used for energization of the corresponding elements of the display as illustrated in FIG. 14. Shift register 151 has the same function as shift register 150 in case of a negative result. In that case, AND-gate 147 is always closed and AND-gate 148 is open for the series of pulses representing the result. Positive results are stored in shift register 150, negative results in shift register 151.

FIG. 16 is a further embodiment of a circuitry for the activation of the elements of the analogue display. It can be used for implementing the allocation of value ranges to elements of FIGS. 5, 6. For the sake of simplicity only the positive part of the display is shown. The circuitry for the elements of the negative value ranges is identical to that of the elements of the positive value ranges. Two decades only have been shown.

Eight lines 160 to 167 transmit the signals needed for two BCD coded decades, for instance decades D1 and D2 of FIG. 14. The weight of lines 160, 164 is 1, that of lines 161, 165 is 2, that of lines 162, 166 is 4 and that of lines 163, 167 is 8. The four lines of each decade are connected to an OR-gate 168, 169 respectively, whose outputs are connected to the inputs of a multiple OR-gate 170 with inverted output. The further inputs shown in FIG. 16 can be connected to OR-gates of further decades not represented, corresponding to OR-gates 168, 169 of decades D1 and D2. The output of OR-gate 170 provides the first input of an AND-gate 171, a line 152 transmitting the output signal of inverter 146 provides the second input of this AND-gate 171. Its output signal controls display element E0. It can be activated only if decades D1, D2, D3, D4 of FIG. 14 have ZERO output signals. The value of the result is then within range 0.0 to 0.9.

Lines 160, 161, 162 and 164, 165, 166 are connected to an AND-gate 172, 173 respectively, whose output signal is a ONE if all three input signals from lines 160, 161, 162 and 164, 165, 166 respectively are ONE. Taking into account the weights of the lines, this means that the value represented is 7. The output of AND-gate 172 and line 163 form the inputs of an OR-gate 182, that of AND-gate 173 and line 167 form the inputs of an OR-gate 183. The allocation of value ranges to elements according to FIG. 5 is hereby realized.

If the output of OR-gate 183 is a ONE, it is transmitted to display element E8 over a diode 174 and at the same time to a pulse former 184, for instance a Schmitt trigger. Further pulse formers 185 to 190 connect, as in FIG. 14, the inputs of adjacent display elements, the input of the pulse former being connected with a display element corresponding to one higher value range than the display element connected to the output of the pulse former. This ensures that the highest activated display element provokes activation of all lower display elements with exception of E0.

Elements E1 to E8 are controlled over diodes 174 to 181, so that the outputs of the gates controlling lines 160 to 167 — not shown in FIG. 16 — and OR-gates 182, 183 are protected.

FIG. 17 shows the circuitry of the analogue display according to FIGS. 10, 11, 12. Elements E29 to E32, E21 to E24, E13 to E16 and E5 to E8 of FIG. 17 correspond exactly to the elements with the same designation in FIG. 11 which lie within the square limited by lines 90, 91. The circuitry for the whole display is obtained by parallel coupling of the symmetrical elements with regard to lines 90, 91 and center 29, as mentioned in the description of FIGS. 11, 12, 13. Each of the elements E5 to E32 of FIG. 17 is controlled by two lines. The lines are numbered 205 to 232 and 305 to 332 so that for example element E14 is controlled by lines 214 and 314. Elements E30, E21, E22 are connected to an additional third line 400. Lines 205 to 232 come from a circuitry not shown in FIG. 17, for instance from that of FIG. 16. Elements E29 to E32 correspond to the lower order decade, elements E21 to E24 to the next decade, elements E13 to E16 to the third decade, elements E5 to E8 to the high order decade. This is valid and lines 205 to 232 can be energized provided the result is positive. If this result is negative, the information will be handled by another circuitry, not shown in FIG. 17, providing the same value ranges to elements allocation and controlling elements E5 to E32 over lines 305 to 332. The distribution of positive and negative values to the two value range circuitries not shown in FIG. 17, can be realized for instance as shown in FIG. 15.

If the value to be displayed lies within the zero range, which can be determined with the circuitry of FIG. 16, a ONE signal is fed over line 400 to elements E30, E21, E22. Thanks to the symmetrical energization already mentioned, the pattern of FIG. 13 is activated. In order to achieve activation of the pattern of FIG. 11, which indicates a positive value, lines 205 to 232 are connected to each other by means of pulse formers P1 to P5. In FIG. 11 element E13 represents the higher order value range. In FIG. 17 this means that the ONE signal in line 213 corresponds to the higher order digit of the value to be displayed. This ONE signal is transmitted to element E24 and pulse former P7 over pulse former P8, and in the same way over all pulse formers to pulse former P1 and element E29. This ONE signal cannot be transmitted to pulse formers N1 to N15 of the negative side, as they are protected by diodes 335 to 362. Similarly, negative values, as shown in FIG. 12, cannot activate pulse formers P1 to P15 because of diodes 235 to 262. In order to achieve the energization corresponding to the negative value of FIG. 12, lines 305 to 332 are connected to each other by pulse formers N1 to N15. Element E14 corresponds to the higher order in the first quadrant of the display according to FIG. 12, line 314 is under tension corresponding to ONE. As already explained this ONE signal is transmitted over the pulse formers N11 to N15 to elements E13 and E5 to E8, as for the representation of negative values elements E5 to E8 correspond to the lower decade and elements E29 to E32 to the higher decade.

Line 400 is connected to elements E30, E21, E22 over diodes 401 to 403 in order to avoid feedback and undesirable coupling. The diodes protecting the elements determining the allocation of value ranges against feedback are not represented in FIG. 17.

We claim:

1. A scale having a digital display for digitally displaying the results of weighing operations, said results falling within discrete value ranges, the length of the highest value range being at least ten times bigger than the length of the lowest value range, an analogue display in said scale for simultaneous analogue displaying of said results of weighing operations, said analogue display comprising at least one group of optically activable elements forming a row, said elements corresponding each to one of said discrete value ranges and being connected to each other so that the elements corresponding to value ranges lower than the value range to be displayed by activation of the corresponding element are also activated.

2. A scale having a digital display for digitally displaying the results of weighing operations, said results falling within discrete value ranges, the length of the highest value range being at least ten times bigger than the length of the lowest value range, an analogue display in said scale for simultaneous analogue displaying of said results of weighing operations, said analogue display comprising groups of four, five or nine optically activatable elements, each group forming a row, said elements corresponding each to one of said discrete value ranges and being connected to each other so that the elements corresponding to value ranges lower than the value range to be displayed by activation of the corresponding element are also activated.

3. A scale having a digital display for digitally displaying the results of weighing operations, said results falling within discrete value ranges, the length of the highest value range being at least ten times bigger than the length of the lowest value range, an analogue display in said scale for simultaneous analogue displaying of said results of weighing operations, said analogue display comprising groups of optically activable elements, each group forming a row, said elements corresponding each to one of said discrete value ranges, each of said groups of elements corresponding to one decade, said elements being connected to each other so that the elements corresponding to value ranges lower than the value range to be displayed by activation of the corresponding element are also activated.

4. A scale having a digital display for digitally displaying the results of weighing operations, said results falling within discrete values ranges, the length of the highest value range being at least ten times bigger than the length of the lowest value range, an analogue display in said scale for simultaneous analogue displaying of said results of weighing operations, said analogue display comprising groups of optically activable elements, each group forming a row, said elements corresponding each to one of said discrete value ranges, two of such groups of elements corresponding to one decade, so that the value displayed in each group grows from the lowest order element of the first group to the highest order element of the second group by a factor of 3 approximately, said elements being connected to each other so that the elements corresponding to value ranges lower than the value range to be displayed by activation of the corresponding element are also activated.

5. A scale having a digital display for digitally displaying the results of weighing operations, said results falling within discrete value ranges, the length of the highest value range being at least ten times bigger than the length of the lowest value range, an analogue display in said scale for simultaneous analogue displaying of said results of weighing operations, said analogue display comprising groups of optically activable elements, each group forming a row, said elements corresponding each to one of said discrete value ranges and being connected to each other so that the elements corresponding to value ranges lower than the value range to be displayed by activation of the corresponding element are also activated, the width of said elements within one group of elements growing transversally to the direction of growing displayed values.

6. A scale having a digital display for digitally displaying the results of weighing operations, said results falling with discrete value ranges, the length of the highest value range being at least ten times bigger than the length of the lowest value range, an analogue display in said scale for simultaneous analogue displaying of said results of weighing operations, said analogue display comprising groups of optically activable elements, each group forming a row, these groups being separated from each other by optically activable marks, said elements corresponding each to one of said discrete value ranges and being connected to each other so that the elements corresponding to value ranges lower than the value range to be displayed by activation of the corresponding element are also activated.

* * * * *